United States Patent [19]

Kerrick

[11] Patent Number: 5,779,836
[45] Date of Patent: Jul. 14, 1998

[54] METHOD FOR MAKING A PRINTED WIRING BOARD

[76] Inventor: Jon P. Kerrick, 15001 Highland La., Minnetonka, Minn. 55345

[21] Appl. No.: 741,825

[22] Filed: Oct. 31, 1996

Related U.S. Application Data

[63] Continuation-in-part of Ser. No. 678,655, Jul. 11, 1996.

[51] Int. Cl.⁶ .................................................. H05K 3/10
[52] U.S. Cl. .................................. 156/150; 427/97
[58] Field of Search ............................ 427/97; 156/150, 156/151

[56] References Cited

U.S. PATENT DOCUMENTS

| | | | |
|---|---|---|---|
| 3,436,819 | 4/1969 | Lumine | 29/628 |
| 4,816,323 | 3/1989 | Inoue | 428/200 |
| 4,933,228 | 6/1990 | Katagiri et al. | 428/209 |
| 5,208,068 | 5/1993 | Davis et al. | 427/97 |
| 5,286,926 | 2/1994 | Kimura et al. | 427/97 X |
| 5,288,541 | 2/1994 | Blackwell et al. | 428/209 |

OTHER PUBLICATIONS

Gore, Electronic Products Division, "The Mixed Dielectric Approach: Improving Speed and Density with Gore–Ply Precision Dielectric Prepreg", Jul. 1990, 6 pages.

Gore, Electronic Products Division, "Gore, Electronic Products Division, Effect of Low Dieelectric Material on Printed Circuit Boards", Apr. 1990, 7 pages.

W.L. Gore, & Associate, Inc., Speedboard™ N High Performance FR–4 Prepreg, Engineer's Summary, Feb. 1994, 2 pages.

W.L. Gore, & Associate, Inc., Advanced Dielectric Products, Speedboard™ Prepregs High Performance Prepregs, Engineer's Summary, copyright 1993, 1 page.

W.L. Gore, & Associate, Inc., Speedboard™ N High Performance FR–4 Prepreg, drawing.

Conduction DP–H Operating Guide, Version 6, LeaRonal, Mar. 1995, 13 pages.

LeaRonal, Inc. advertisement "Conductron: A Direct Hit☐", (undated) 2 pages.

*Primary Examiner*—Francis J. Lorin
*Attorney, Agent, or Firm*—Christie, Parker & Hale, LLP

[57] ABSTRACT

Described is a method of making a double-sided printed wiring board (PWB) comprising a core of electrically conductive material to improve the thermal distribution and cross-talk shielding of the PWB. Relief apertures and separation slots are chemically milled into the core. A layer of particulate-free dielectric material and a layer of conductive material are laminated to both sides of the core and dielectric material substantially fills the relief apertures during lamination. Holes are drilled through the PWB at the relief apertures to accommodate electrical communication between both sides of the board. Holes are also drilled through the conductive material of the core to accommodate an electrical ground. The surface of the PWB and the side walls of the holes are coated with a second layer of electrically conductive material.

22 Claims, 2 Drawing Sheets

METHOD FOR MAKING A PRINTED WIRING BOARD

CROSS-REFERENCE TO RELATED APPLICATION

This application is a continuation-in-part of patent application Ser. No. 08/678,655 filed on Jul. 11, 1996.

FIELD OF THE INVENTION

The invention relates to a method for making a printed wiring board, and more particularly a method for making a double-sided printed wiring board comprising a composite of two layers of dielectric material laminated to an electrically conductive core.

BACKGROUND OF THE INVENTION

A printed wiring board ("PWB") is the interconnection medium upon which wiring components are formed into electronic systems. The two primary functions of PWBs are to provide support for wiring components and to interconnect these components electrically. As the performance, efficiency, and reliability requirements for electronic systems increase, there is a corresponding need for improvements in all aspects of PWB technology.

In an increasing number of applications, the commonly available PWB is proving to be thermally inadequate. The glass-based laminates generally used in PWBs have relatively low thermal conductivities and result in poor heat management within the PWB. Another problem of such boards is "cross-talk" which is a phenomenon that may occur as the speed of these electronic systems increase.

In addition to the foregoing problems, glass-based laminates have a tendency to contaminate their work environment. Glass-based laminates contain particles and fibers which can dislodge, most frequently at the cut edges of the PWB. Certain PWB applications, especially those with moving parts such as hard disk drives, require a particle-free environment ("zero particulate count"). PWBs having ceramic substrates are suitable for such application, but they are also very rigid and hence susceptible to breakage. Furthermore, ceramic PWBs are prohibitively expensive.

Accordingly, one object of the invention is to provide a method for making a PWB that exhibits both enhanced thermal heat dissipation and improved electromagnetic interference shielding to avoid or minimize "cross-talk."

A further object of the invention is to provide a method for making an economical and flexible PWB for use in environments which require a zero particulate count.

SUMMARY OF THE INVENTION

The present invention provides a method for making a novel PWB comprising an electrically conductive core laminated on both sides with dielectric material. The method involves laminating each side of the core with a layer of dielectric material and then coating the dielectric material with two or more layers of an electrically conductive material, into which a desired conductive pattern of the PWB may be developed.

More particularly, the invention comprises a method of making a PWB comprising the steps of: (a) providing a core comprising a sheet of electrically conducted material having a plurality of apertures through the core; (b) filling the apertures with a dielectric material; (c) laminating a layer of a dielectric material onto the upper and lower surfaces of the core; (d) laminating a layer of electrically conductive material onto one of the layers of dielectric material on the core; (e) providing a first hole through the dielectric material in at least one of the apertures in the core; (f) providing a second hole through the electrically conductive material in the core; and (g) coating the layers of dielectric material on upper and lower surfaces of the core and the side walls of the first and second holes with a layer of electrically conductive material.

In accordance with one embodiment of the present invention, the core comprises a sheet of copper with oxide layers formed on the upper and lower surfaces of the core. A number of relief apertures and separation slots may be produced in the core and a layer of dielectric material comprising a sheet of expanded teflon coated with epoxy resin, and a layer of copper foil are laminated onto opposite sides of the copper core. A layer of copper is then electroplated onto the copper foil and the sidewalls of the holes. After appropriate masking and etching, the desired conductive pattern for the PWB is developed. A layer of photo resist material may then be applied over the dielectric material to protect that surface, and a layer of gold or palladium applied onto the wire bonding sites on the copper layer.

BRIEF DESCRIPTION OF THE DRAWINGS

The foregoing and other features of the invention will become apparent in the following detailed description of a presently preferred method taken in conjunction with the accompanying drawings, wherein.

DETAILED DESCRIPTION

Figure 1:
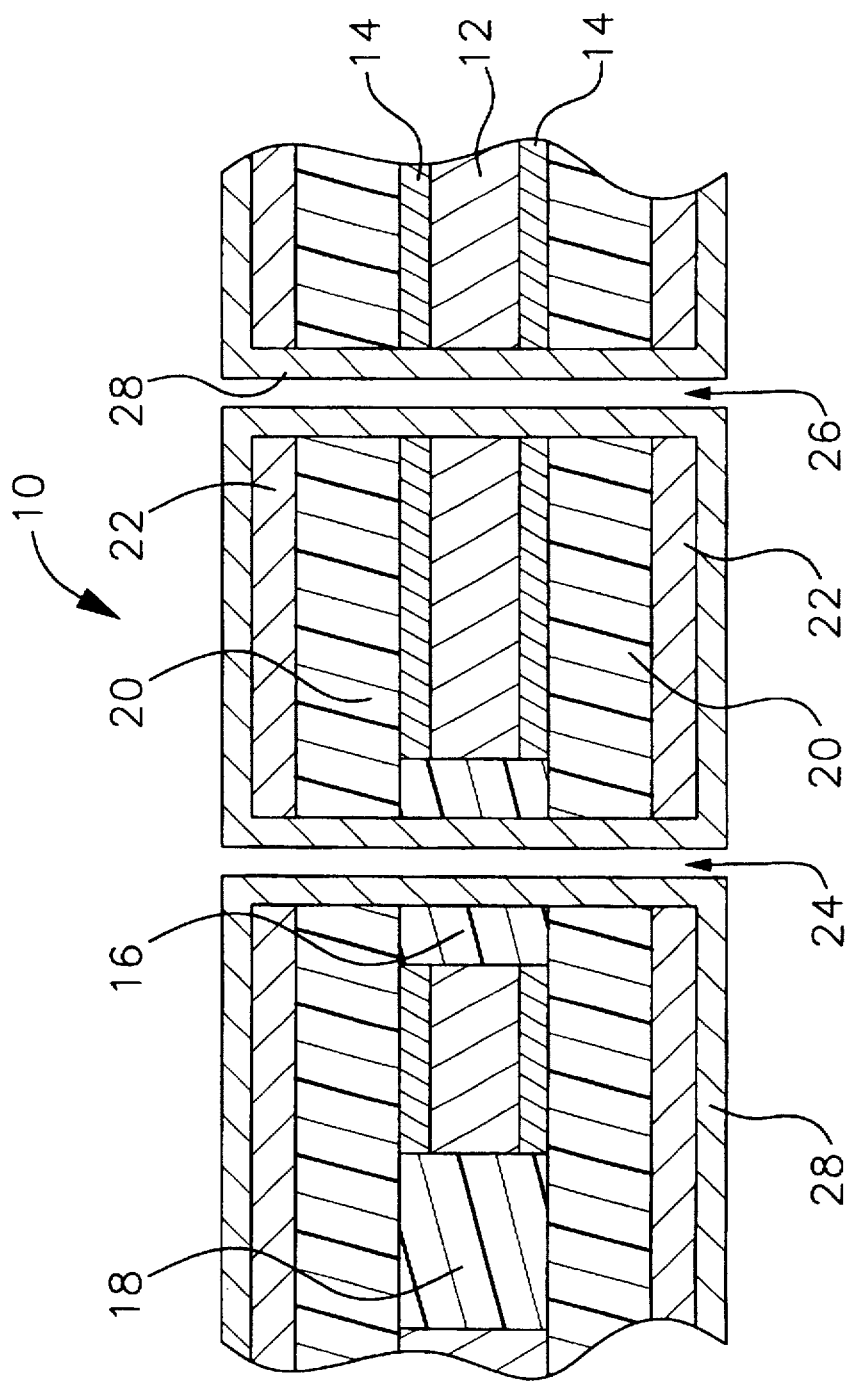
FIG. 1 is a schematic diagram of the cross section of a printed wiring board.

The following describes a method for making a double-sided dielectric/conductor/dielectric printed wiring board ("PWB"), an example of which is illustrated in FIG. 1.

Figure 2:
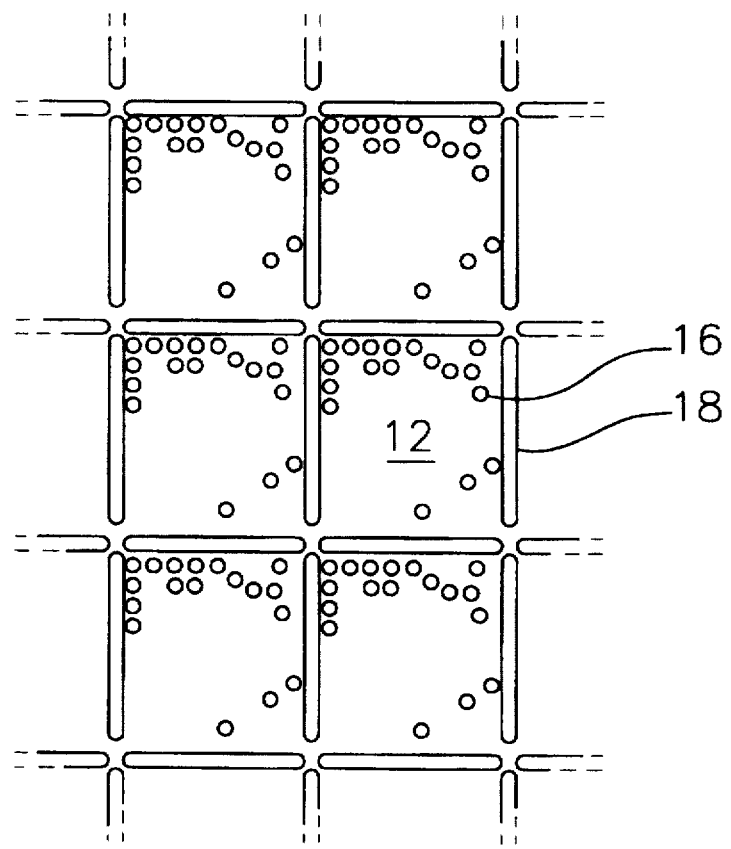
FIG. 2 is a top view of a sheet of core material having apertures and separation slots.

The PWB 10 of FIG. 1 comprises a core of an electrically conductive material 12 with a thin oxide layer 14 on its upper and lower surfaces. The PWB includes a number of relief apertures 16 and separation slots 18 (FIG. 2). The separation slots, which extend completely through the core, facilitate the separation of individual PWBs manufactured from a common sheet of core material. The apertures are substantially filled with a dielectric material.

The core is sandwiched between two layers of dielectric material 20. A first layer of conductive material 22 is laminated over the dielectric layers.

A first hole 24, or "via" hole, is provided for accommodating electrical connection between the two sides of the board. The via hole extends completely through the board such that it passes through the dielectric material in a relief aperture, thereby insulating it from the conductive material in the core. A second hole 26, or "ground hole," is provided for accommodating an electrical ground connection. The ground hole extends completely through the board such that it passes through the conductive material in the core. The surface of first conductive layer 22 and the side walls of via hole 24 and ground hole 26 are coated with a second layer of electrically conductive layer 28.

Relief apertures 16 and separation slots 18 are produced in the core. Preferably, a copper sheet not greater than about 10 mil (0.010 inch) is used as the conductive core because it enables the apertures to be formed by chemical milling while still providing the desired heat distribution and "cross-talk" shielding characteristics as a thick conductive core. Chemical milling is a well known process used for producing holes in metal sheets, such as in metal filters. It is also a preferred method for producing the separation slots in lieu of mechanically routing the slots, which would be difficult and costly.

Prior to chemical milling, the copper sheet is advantageously cleaned first using a degreaser and then a mild chemical etch, and then is subsequently dried. In addition to removing dirt and tarnish, this cleaning step removes any material remaining from treatments applied to the sheet surface by the supplier.

A photo imagable mask may be used to define the apertures 12 and slots 14 to be chemically milled (FIG. 2). The mask is formed by first applying an aqueous photo resist film using hot rollers which melt the film to the copper sheet. The photo resist is then exposed to UV light through a mask defining the desired pattern of relief apertures and separation slots. Due to etch-back associated with the chemical milling process, the areas defined by the photo resist are smaller than the final dimensions desired in the copper core.

An aqueous caustic developer is then used to develop the photo resist, leaving the areas of copper to be etched exposed and the remaining surface protected by the photo resist. Chemical milling is performed by a series of high pressure jets which spray a high pH etchant, such as ferric chloride, to cut through the exposed copper core.

After chemical milling, the photo resist is stripped using an aqueous stripper. It should be noted that aqueous photo resists, developers, and strippers are particularly desirable to avoid introducing solvents to the copper surface. The copper sheet is then cleaned and dried in preparation for oxidation.

Oxide layers 14 are formed on the upper and lower surfaces of the copper core to preserve the characteristics of the copper and, due to their rough surface, improve adhesion with the laminates. The oxide layers, preferably about 5 microns thick, improve adhesion by roughening the surface of the core. The oxide layers are formed by exposing the core to an oxidizing agent. After oxidation, the core is dried by heating in preparation for lamination.

A layer of a dielectric material 20 and a first layer of electrically conductive material 22, in this example ½ oz. copper foil, are simultaneously laminated to both sides of the core, such that the dielectric layer is sandwiched between the foil layer and the core. The dielectric laminate is preferably a partially cured resin board, also called a "pre preg" or "B-stage," with a resin content of about 80%. In the preferred embodiment, the dielectric laminate selected is a non-woven, or expanded, teflon sheet about 1 mil thick coated with an epoxy resin. One example of a commercially available material with these properties is "Speedboard N," available from W. L. Gore & Associates, Inc. located in Elkton, Md.

The use of this dielectric material has several advantages in the production of the PWB. Resin tends to flow during lamination due to the high pressures and temperatures involved. The high resin content of the preferred dielectric provides enough resin flow to substantially fill the apertures. Also, the epoxy resin in the relief apertures effectively insulates the electrically conductive material 28 plated to the side walls of via holes 24 from being shorted to the conductive core. In addition, the non-woven teflon material contains no loose particles or fibers, and therefore ensures that no particles will escape from cut surfaces of the PWB. This is an improvement over conventional fiberglass board which contain particles and fibers that tend to dislodge and contaminate their work environment. A PWB produced according to the method of the present invention is therefore desirable for work environments containing moving parts, e.g., hard disk drives, which require a particle-free environment ("zero particulate count").

The relatively thick copper core in combination with this dielectric material has several advantages in the method of the present invention. A PWB comprising a thick conductive core requires less dielectric material than a conventional PWB having a resin coated fiberglass board substrate. For example, in the preferred method, a 2.4 mil layer of dielectric material is laminated to each side of the core whereas a conventional PWB has dielectric layers 4 mil thick. Using less dielectric material reduces material costs. Also, a desired dielectric constant of 3.2 is readily achieved with a thin layer of the preferred dielectric material, Speedboard N. In addition, the devices on the PWB are closer to the conductive core, and thus better utilize its thermal properties.

A Burkle hot oil press may be used to laminate the dielectric and foil layers to the conductive core. In a Burkle press, temperature in the lamination chamber is regulated by hot and relatively cool oil flowing through coils in the "bolster" plates containing the chamber. Such a press provides a good temperature profile and better temperature control than lamination presses utilizing electric coils.

In operation, a number of lamination assemblies may be laminated simultaneously. Lamination assemblies comprising the core, dielectric layer, and copper foil, are stacked in a "book" with a steel separator sheet placed between each assembly. When the lamination assemblies are loaded into the lamination chamber, a vacuum, e.g., of about 29 atmospheres, is pulled. This creates an air-free environment and prevents the formation of air bubbles in the dielectric layers. The books are placed between "coul" plates approximately ¾" thick which are then placed between the bolster plates. The bolster plates and lamination chamber are both equipped with thermocouples.

The flow of the hot and relatively cool oil through the coils in the bolster plates is regulated to achieve the desired heating profile for the lamination assemblies. A mechanical press simultaneously applies pressure to the assemblies. A desired lamination cycle consists of applying 175 psi of pressure for 2 hours and 10 minutes at 360° F.; reducing the pressure to 50 psi and chamber temperature to 125° F. for 10 minutes; and finally reducing pressure to 20.69 psi and chamber temperature to 50° F.

Subsequent to lamination, the edges of the board assembly are cleaned to remove any resin squeezed out during lamination ("flash").

The via and ground holes are then drilled with a high speed, carbide-tip drill. "Burr" may be a problem associated with high-speed drilling and refers to the lifting up of the work surface at the drill site. A foil is placed over the board assembly to reduce the amount of burr formation. In this example, the via holes are 0.0135" in diameter and the ground holes are 0.016". A 4 mil clearance between the via holes and the core is desirable to avoid dielectric breakdown.

The board assembly is then baked at 325° F. for hours to carbonize the drilled holes. This step prepares the holes for a subsequent plasma cleaning step and also partially cures the pre preg.

Following baking, the board assembly is advantageously exposed to a helium plasma field to clean the drilled holes of any resin that may have flowed over the conductive material in the core during the previous steps. The surface is subsequently etched to clean the surface of the holes to facilitate plating.

A layer of carbon is direct-plated to the surface of the drilled holes. Direct plating is a process used to condition a surface for electroplating, and comprises depositing a thin layer of carbon to which the electroplated metal adheres. Another process which may be used in conjunction with electroplating is electroless plating. However, electroless plating is a less preferred method because it can contribute to void formation at the teflon sheet sites in the hole walls during electroplating of the second conductive layer. Also, electroless plating processes use activators which may contaminate the surface of the hole walls. Conversely, a direct plating process, such as the Conductron process, the equipment for which is available from Lea Ronal, Inc. located in Freeport, N.Y., requires no such activators.

A second layer of electrically conductive material is electroplated to the surface of the board. In the preferred method, a thin layer of copper is "panel plated" to both sides of the board. Panel plating consists of first electroplating the metal to the board surface. Next, a photo imagable mask is applied to the surfaces and developed into the desired circuitry pattern so that the copper to remain is covered with the photo resist and the rest of the board surface is exposed. The exposed copper of the first and second conductive layers is then etched away. The photo resist is then stripped and the surface of the PWB cleaned.

A solder mask material or other high temperature photo resist is advantageously applied to serve as a permanent protection layer for the dielectric portion of the PWB surface. Doctor blades apply the solder mask in liquid form to a sheet of PWBs. The solder mask is then cured into a pre preg which is photo imaged and developed to the desired pattern. Thereafter, the solder mask is cured both with heat (305° F. for 90 minutes) and UV light.

It may also be desirable to apply a wire bondable gold or palladium surface to the conductive layers to facilitate wire bonding. This may be done, for example, by first cleaning the PWB surfaces by exposure to a helium plasma field. Next, an extremely thin layer of electroless nickel is applied, followed by an even thinner layer of electroless soft-gold. The nickel layers may be 0.000125 to 0.00025 inches thickness and the gold between 0.000025 to 0.000050 inches thickness. Alternatively, a less expensive electroless palladium wire bonding layer may be used.

Once the gold or palladium has been applied, it is desirable to bake the composite at 300° F. for about 1 hour to ensure that the wire bonding layer and solder mask sufficiently adhere to the board.

It is apparent from the foregoing that various changes and modifications may be made without departing from the invention. Accordingly, the scope of the invention should be limited only by the appended claims wherein:

What is claimed is:

1. A method for manufacturing a printed wiring board comprising the steps of:
   (a) providing a core of electrically conductive material having a plurality of apertures through the core, said core having an upper and lower surface;
   (b) substantially filling said apertures with a dielectric material;
   (c) laminating a layer of dielectric material onto the upper and lower surfaces of the core;
   (d) laminating a first layer of electrically conductive material onto both layers of dielectric material to produce a board assembly;
   (e) making a first hole through dielectric material in at least one aperture which extends through the board assembly, the interior of said hole having side walls;
   (f) making a second hole through the board assembly which extends through the core, said hole having side walls; and
   (g) coating the upper and lower surfaces of the board assembly and the side walls of said first and second holes with a second layer of electrically conductive material, the electrically conductive material on the side walls of the first hole being electrically insulated from the core.

2. The method of claim 1 wherein steps (b) and (c) are performed simultaneously.

3. The method of claim 1 wherein the core comprises copper.

4. The method of claim 1 wherein the thickness of the core is not more than 10 mil.

5. The method of claim 1 further comprising forming an oxide layer on the upper and lower surfaces of the core prior to step (b).

6. The method of claim 5 wherein the thickness of the oxide layer on each surface of the core is about 5 microns.

7. The method of claim 1 further comprising producing a plurality of separation slots in the core.

8. The method of claim 7 wherein the apertures and separation slots are produced by chemical milling.

9. The method of claim 1 wherein the dielectric material is present as a plurality of layers.

10. The method of claim 1 wherein the dielectric material comprises expanded polytetrafluorethylene coated with an epoxy resin.

11. The method of claim 1 wherein the thickness of the layer of dielectric material is between about 2 and 3 mil.

12. The method of claim 1 wherein the first layer of electrically conductive material comprises copper.

13. The method of claim 12 wherein the first layer of electrically conductive material comprises ½ oz. copper foil.

14. The method of claim 1 wherein the second layer of electrically conductive material comprises copper.

15. The method of claim 1 wherein steps (c) and (d) are performed together.

16. The method of claim 1 wherein said first and second holes are produced by mechanical drilling.

17. The method of claim 1 wherein the first hole comprises a hole for accommodating electrical communication between both sides of the board assembly, said hole having a diameter of between about 0.01 and 0.02 inches.

18. The method of claim 1 wherein the second hole comprises a hole for accommodating an electrical ground, said hole having a diameter of between about 0.01 and 0.02 inches.

19. The method of claim 1 further comprising coating the sidewalls of the first and second holes with a layer of carbon.

20. The method of claim 1 further comprising producing a circuitry pattern in the layers of electrically conductive material on the upper and lower surfaces of the board assembly.

21. The method of claim 20 further comprising coating at least a portion of the circuitry pattern with a photo resist material.

22. The method of claim 20 wherein the circuity pattern comprises a plurality of wire bonding sites and wherein the method further comprises coating the wire bonding sites with a layer of gold or palladium adapted to facilitate wire bonding.

* * * * *

UNITED STATES PATENT AND TRADEMARK OFFICE
CERTIFICATE OF CORRECTION

PATENT NO. : 5,779,836
DATED : July 14, 1998
INVENTOR(S) : Jon P. Kerrick

It is certified that error appears in the above-indentified patent and that said Letters Patent is hereby corrected as shown below:

On the title page insert the Assignee as follows:
    -- [73] Assignee: Advance Circuits, Inc.,
                          Minnetonka, Minn. --.

Signed and Sealed this

Sixth Day of July, 1999

*Attest:*

Q. TODD DICKINSON

*Attesting Officer*      *Acting Commissioner of Patents and Trademarks*